United States Patent
Feuillet et al.

(10) Patent No.: US 12,252,807 B2
(45) Date of Patent: Mar. 18, 2025

(54) PROCESS FOR OBTAINING A NITRIDE LAYER

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

(72) Inventors: Guy Feuillet, Saint-Martin d'Uriage (FR); Blandine Alloing, Valbonne (FR); Virginie Brandli, Valbonne (FR); Benoit Mathieu, Grenoble (FR); Jesus Zuniga Perez, Biot (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 1135 days.

(21) Appl. No.: 16/956,374

(22) PCT Filed: Dec. 24, 2018

(86) PCT No.: PCT/EP2018/086865
§ 371 (c)(1),
(2) Date: Feb. 10, 2021

(87) PCT Pub. No.: WO2019/122461
PCT Pub. Date: Jun. 27, 2019

(65) Prior Publication Data
US 2021/0164126 A1     Jun. 3, 2021

(30) Foreign Application Priority Data

Dec. 22, 2017   (FR) .................................... 17 63186

(51) Int. Cl.
*C30B 25/18*      (2006.01)
*C30B 29/40*      (2006.01)
(Continued)

(52) U.S. Cl.
CPC .......... *C30B 25/186* (2013.01); *C30B 25/183* (2013.01); *C30B 29/406* (2013.01);
(Continued)

(58) Field of Classification Search
CPC ... C30B 25/186; C30B 25/183; C30B 29/406; C30B 29/403; H01L 33/007; H01L 33/12; H01L 33/32
See application file for complete search history.

(56) References Cited

U.S. PATENT DOCUMENTS

2002/0013036 A1*  1/2002  Gehrke ............... H01L 21/0254
                                             257/E21.123
2010/0087049 A1*  4/2010  Kononchuk .......... H01L 21/187
                                             257/E21.09
(Continued)

FOREIGN PATENT DOCUMENTS

| CN | 102741999 A | 10/2012 |
| CN | 102969424 A | 3/2013 |
| EP | 2 502 266 B1 | 3/2020 |

OTHER PUBLICATIONS

Combined Chinese Office Action and Search Report issued Aug. 13, 2021 in Chinese Patent Application No. 201880089951.7, 11 pages.
(Continued)

*Primary Examiner* — Marcos D. Pizarro
*Assistant Examiner* — Tiberiu Dan Onuta
(74) *Attorney, Agent, or Firm* — Oblon, McClelland, Maier & Neustadt, L.L.P.

(57) ABSTRACT

A process for obtaining a nitride (N) layer preferably obtained from at least one of gallium (Ga), indium (In) and
(Continued)

aluminium (Al), may include: on a stack including a substrate and at least the following layers successively disposed from the substrate: a creep layer having a glass transition temperature, $T_{glass\ transition}$, and a crystalline layer, forming pads by etching the stack so that each pad includes at least a creep segment formed by at least a portion of the creep layer, and a crystalline segment formed by the crystalline layer; and growing by epitaxy a crystallite on each of the pads and continuing the epitaxial growth of the crystallites so as to form the nitride layer. The epitaxial growth may be carried out at a temperature $T_{epitaxy}$, such that $T_{epitaxy} \geq k1 \times T_{glass\ transition}$, with k1 being 0.8.

20 Claims, 7 Drawing Sheets

(51) Int. Cl.
H01L 33/00 (2010.01)
H01L 33/12 (2010.01)
H01L 33/32 (2010.01)

(52) U.S. Cl.
CPC ............ *H01L 33/007* (2013.01); *H01L 33/12* (2013.01); *H01L 33/32* (2013.01)

(56) References Cited

U.S. PATENT DOCUMENTS

| | | | |
|---|---|---|---|
| 2010/0109126 A1* | 5/2010 | Arena | H01L 29/0684 257/E29.089 |
| 2012/0119218 A1 | 5/2012 | Su | |
| 2012/0161149 A1* | 6/2012 | Wuu | H01L 21/02002 257/E29.089 |
| 2012/0319128 A1 | 12/2012 | Arena | |
| 2013/0048941 A1 | 2/2013 | Yu et al. | |
| 2014/0312463 A1 | 10/2014 | Arena | |

OTHER PUBLICATIONS

International Search Report issued Feb. 15, 2019 in PCT/EP2018/086865 filed on Dec. 24, 2018, 3 pages.

Zubia et al, "Nanoheteroepitaxial growth of GaN on Si by organometallic vapor phase epitaxy," Applied Physics Letters, vol. 76, No. 7, pp. 858-860, XP12025868, Feb. 2000.

* cited by examiner

PROCESS FOR OBTAINING A NITRIDE LAYER

TECHNICAL FIELD OF THE INVENTION

The present invention generally relates to the techniques for growing nitride (N) layers obtained from at least one material selected from gallium (Ga), indium (In) and aluminium (Al) on one face of a crystalline layer.

The invention finds in particular as advantageous application the field of light-emitting diodes (LEDs) and lasers.

STATE OF THE ART

Modern commercial optoelectronic devices and particularly light-emitting diodes (LEDs) and lasers use semiconductor materials comprising a nitride (N) obtained from at least one material selected from gallium (Ga), indium (In) and aluminium (Al). This type of nitride is conventionally obtained by epitaxial growth from a crystalline layer.

A major challenge consists in minimising the density of defects in the nitride layer obtained by epitaxy. Indeed, electroluminescent devices such as LEDs and lasers are very sensitive to the density of structural defects such as dislocations. These defects act as non-radiative recombination centres which limit the emission efficiency. The performance of electroluminescent devices is therefore greatly degraded when the density of defects in the nitride layer is high.

Several reasons explain the presence of dislocations.

A first reason is that the epitaxial growth of the nitride layer is carried out on hetero-substrates, that is to say on substrates whose material and therefore the lattice parameters are different from those of the nitride layer that is to be subjected to epitaxy.

A second reason for the presence of dislocations is that epitaxial growth takes place in a columnar fashion. This is mainly related to the low diffusivity of the species on the surface of the hetero-substrate during growth, which results in the formation of small grains. During coalescence, these grains join, forming at their interface, that is to say at the coalescence joint, dislocations which then cross the entire epitaxial structure.

The most direct way to solve these problems is to use substrates of the same kind as the layers to be subjected to epitaxy (homo-substrates). For example, in the case of nitride materials which cover the emission ranges from infrared to deep ultraviolet, use can be made of GaN substrates to epitaxially grow GaN-based blue emitting structures, or AlN substrates for emissive structures in deep UV. The epitaxy is then easy. Indeed, the epitaxial layer reproduces the structure of the underlying substrate without grains and therefore coalescence joints. Thus, the presence of dislocations is avoided.

However, these substrates are not commercially available or are only of small dimensions, typically with a diameter of less than one inch (2.5 cm), which does not allow cutting substrates of sufficient dimensions therefrom for the considered industrial applications.

The solutions considered to date for industrial applications are therefore mainly based on the use of hetero-substrates.

However, when using hetero-substrates, numerous dislocations are generated in the epitaxial layers and these defects propagate even in the active areas of the device. One solution to reduce the density of dislocations consists in using methods called "lateral overgrowth" or ELOG, acronym for "epitaxial lateral overgrowth".

The principle of this method is based on the fact that at a certain stage of epitaxial growth, a mask having openings is deposited. The growth germs grow in the openings and then above the mask by lateral overgrowth. Lateral overgrowth results in the curvature of dislocations from the germs, which therefore prevents their vertical spread. This type of process therefore allows to eliminate a large number of dislocations by curvature, but dislocations are also created during coalescence. When two crystallites from two adjacent openings join above the mask, a coalescence joint is formed and the dislocation can reach the surface.

In practice, if it is observed that the dislocations under the mask are effectively blocked, the dislocations which manage to propagate through the openings of the mask propagate in the epitaxial layer and can reach the surface.

Of course, the density of threading dislocations resulting from coalescence is greatly reduced compared to what it is in the case of "natural" coalescence, since the "grains" are of larger dimensions (typically of the order of the period of the openings in the mask). However, these dislocations are distributed in a non-uniform manner, which can be problematic during the manufacturing of the devices, since resulting from the formation of strips of non-luminescent material directly above these areas.

Another solution consists in making the material increase by epitaxy on pre-existing pads of this material: this is the process called pendeo-epitaxy process which allows to dispense with the overgrowth on the mask. On the other hand, the known pendeo-epitaxy solutions do not allow to eliminate or even significantly reduce the appearance of defects generated by the coalescence of adjacent germs.

There is therefore a need consisting in proposing a solution for obtaining a nitride (N) layer obtained from at least one of gallium (Ga), indium (In) and aluminium (Al) and having a significantly reduced defect density.

The other objects, features and advantages of the present invention will become apparent upon examining the following description and the appended drawings. It is understood that other advantages can be incorporated.

SUMMARY OF THE INVENTION

According to an exemplary embodiment, the object of the present invention is a process for obtaining at least one nitride (N) layer preferably obtained from at least one of gallium (Ga), indium (In) and aluminium (Al). The process comprises the following steps:
- providing a stack comprising a substrate and at least the following layers successively disposed from the substrate:
  - a creep layer having a glass transition temperature $T_{glass\ transition}$,
  - a crystalline layer,
- forming pads by etching at least the crystalline layer and at least a portion of the creep layer so that each pad includes at least:
  - a creep segment formed by at least one portion of the creep layer,
  - a crystalline segment formed by the crystalline layer and surmounting the creep segment;
- growing by epitaxy a crystallite on at least some of said pads and continuing the epitaxial growth of the crystallites at least until coalescence of the crystallites carried by two adjacent pads, so as to form said nitride layer, the epitaxial growth being carried out at a temperature $T_{epitaxy}$, such that:

$T_{epitaxy} \leq k1 \cdot T_{glass\ transition}$, with $k1 = 0.8$

Thus, during epitaxy, the portion of the pad which is formed by the creep segment reaches (or exceeds) its glass transition temperature or a temperature very close to the latter. Under the force of a mechanical stress, this pad portion can thus deform. Thus when two crystallites come into contact and coalesce, the mechanical stresses generated by this contact are transferred to the pads and therefore to the creep segments. The latter deforms, thereby absorbing some or all of the mechanical stresses. It is thus possible to considerably reduce, or even avoid, the appearance and the propagation of dislocations at the coalescence joints between two crystallites.

Particularly, if the crystallites are disoriented relative to each other in the plane wherein the substrate mainly extends ("twist") or out of plane ("tilt"), the disorientation between crystallites results in the creation of a grain joint in the coalescence. This grain joint is highly energetic since it results from the superposition of the stress fields of the defects which compose it. If the crystallites grow on pads which can deform, the adjacent crystallites are oriented in the plane or out of plane to minimise the total elastic energy of the system without the formation of grain joints.

The invention thus allows to obtain nitride (N) layers obtained from at least one of gallium (Ga), indium (In) and aluminium (Al) having a significantly reduced density of dislocations.

Consequently, the process according to the invention provides a particularly effective solution to the problem of the generation of defects related to coalescence. This process, particularly when applied to crystallites produced on an SOI (silicon on insulator) type substrate and of nanometric dimensions, results in a very noticeable reduction in the density of defects related to coalescence, allowing the creation of pseudo-substrates with very low dislocation densities.

The invention also has the advantage of making it easier to obtain LEDs emitting in the red wavelength. Indeed, the invention allows to obtain layers of the GaInN alloy having little or even no defects and stresses, which will allow to incorporate more indium and therefore to obtain red LEDs more easily.

Before starting a detailed review of embodiments of the invention, optional features which may optionally be used in combination or alternatively are set out below.

According to an exemplary embodiment, at the start of epitaxial growth, each crystallite is entirely supported by only one pad. Preferably, during the epitaxial growth step, a crystallite is developed on each of the pads.

According to an exemplary embodiment, the creep layer is made of a viscous material. It has a visco-plastic transition. Preferably this material is taken from:
- a silicon oxide SixOy, x and y being integers. Preferably, the creep layer is made of SiO2,
- a glass,
- a borosilicate glass,
- a borophosphosilicate glass (BPSG)

According to an exemplary embodiment, k1=0.87 or k1=0.9.

According to a particularly advantageous example, k1=0.92. Thus, in the case where the creep segments are formed of SiO2, $T_{epitaxy} \geq 1104°$ C., $T_{glass\ transition}$ for SiO2 being equal to 1200° C.

According to an even more preferred exemplary embodiment, k1=0.95. According to an even more preferred exemplary embodiment, k1=1, and preferably k1=1.5.

According to an exemplary embodiment, $T_{epitaxy} \leq k2 * T_{melting\ min}$, $T_{melting\ min}$ being the lowest melting temperature among the melting temperatures of the materials forming the segments of the pad. This is mainly the crystalline segment and the creep segment.

According to an exemplary embodiment, k2=0.9. This allows to avoid the diffusion of the species of the material whose melting temperature is the lowest.

Thus, in the case where the pad is formed of SiO2 creep segments and of silicon crystalline segments, $T_{epitaxy} \leq 1296°$ C. Indeed, $T_{melting\ min}$ is equal to the melting temperature of silicon since the melting temperature of silicon is equal to 1440° and the melting temperature of SiO2 is equal to 1970° C.

Preferably, k2=0.8.

According to an exemplary embodiment, the pads comprise at least one buffer layer, made of a material different from that of said nitride layer, surmounting the crystalline layer, and preferably said nitride layer is a gallium nitride (GaN) layer and the buffer layer is made of aluminium nitride (AlN).

This allows, when said nitride layer is a gallium nitride (GaN) layer, to avoid the appearance of the phenomenon of melt back etching, generated by the very high reactivity between gallium and silicon.

According to an exemplary embodiment, the buffer layer is formed by epitaxy deposition on top of the crystalline layer, before the step of forming the plurality of pads by etching.

According to an exemplary embodiment, the stack comprises, before the step of epitaxial growth of said nitride layer, at least said buffer layer.

The fact of forming the plurality of pads by etching after forming the buffer layer above the crystalline layer, allows to prevent the buffer layer from being deposited between the pads, typically on the bottom of the creep layer or from being deposited on the walls of the segments formed by the crystalline layer, which would have been the case if this step of forming the buffer layer had been carried out after etching the stack to form the pads. Thus, this prevents epitaxial growth of the nitride layer from the creep layer. Naturally, this advantage is observed when the growth of the nitride layer deposited by epitaxy is carried out selectively. Indeed, this growth occurs on the material of the buffer layer but does not occur on the material of the creep segments. This is the case when the latter are made of SiO2, the buffer layer is made of AlN and the nitride layer deposited by epitaxy, for example according to a MOVPE (organometallic vapour phase epitaxy) technique, is GaN. Thus the latter is not deposited at the base of the pads.

According to an exemplary embodiment with or without a buffer layer, said nitride layer is a gallium nitride (GaN) layer and the pads comprise, before the step of epitaxial growth of said nitride layer, at least one primer layer, surmounting said buffer layer and made of gallium nitride (GaN).

According to an exemplary embodiment, the stack comprises, before said step of forming the pads by etching, at least one primer layer, surmounting said crystalline layer, the primer layer being made of the same material as said nitride layer.

Thus, in an embodiment wherein said nitride layer is GaN, the primer layer is also made of GaN.

Advantageously, this primer layer allows to facilitate the resumption of epitaxial growth for the formation of crystallites. This feature is all the more advantageous since the surface of the top of the pads is small.

Thus, if the top of the pad, that is to say the upper face of the pad, uncovered, is formed by the crystalline segment, then the crystallites directly in contact with the crystalline layer are grown by epitaxy.

Thus, if the top of the pad is formed by the primer layer, then the crystallites directly in contact with the primer layer are grown by epitaxy.

Thus, if the top of the pad is formed by the buffer layer, then the crystallites directly in contact with the buffer layer are grown by epitaxy.

Preferably, the primer layer is disposed directly in contact with the upper face of the crystalline segment.

Each pad has an upper face and wherein the epitaxy growth of the crystallites takes place at least in part and preferably only from said upper face.

Preferably, the buffer layer is disposed directly in contact with the upper face of the crystalline segment or in contact with the upper face of the segment formed by the primer layer.

According to one example, at least one of the buffer layer and the primer layer maintains a constant thickness during the epitaxy growth step.

According to an exemplary embodiment, providing said stack amounts to providing an elaborate substrate of the silicon on insulator (SOI) type comprising a base substrate surmounted successively by an oxide layer forming said creep layer and a semiconductor layer forming said crystalline layer.

According to an exemplary embodiment, the height $e_{220}$ that the creep segment must have is such that $e220 \geq 0.017 \cdot d_{pad}$, $d_{pad}$ being the diameter of the pad or more generally the distance edge to edge of the pad taken, at the creep segment and in a direction parallel to the main plane wherein the substrate extends, for example along the horizontal in FIGS. 1c to 1e.

Preferably, $e220 \geq 0.05 \cdot d_{pad}$. Preferably, $e220 \geq 0.1 \cdot d_{pad}$. Preferably $e220 \geq 1 \cdot d_{pad}$.

These values allow to obtain sufficient deformation to reduce the stresses at the grain joint.

According to one example, $d_{crystallite}/d_{pad} \geq k3$, $d_{pad}$ being the diameter of the pad or more generally the distance edge to edge of the pad taken, that is to say the maximum dimension of the pad regardless of the shape of its section, at the creep segment and in a direction parallel to the main plane wherein the substrate extends, for example along the horizontal in FIGS. 1c to 1e. $d_{crystallite}$ corresponds to the dimension of the crystallite measured in the same direction as $d_{pad}$. It will be noted that $d_{crystallite}$ corresponds to the pitch between two pads. Thus, as illustrated in FIGS. 1c to 1e, at the time of the coalescence $d_{crystallite} = D + d_{pad}$.

Particularly effective results have been obtained for k3=3. According to an example $100 \geq k3 \geq 3$. Preferably $50 \geq k3 \geq 3$. Preferably $5 \geq k3 \geq 3$.

This feature allows the creep segments to deform in order to absorb in a particularly effective manner the mechanical stresses which arise when two adjacent crystallites begin to coalesce. Thus, this feature effectively contributes to reducing the density of defects within the nitride layer obtained in the end.

According to an exemplary embodiment, the segments have a height e220 and two adjacent pads are spaced by a distance D, such that:

$e220/D<1$, and preferably $e220/D<1.5$. Preferably $e220/D<2$.

According to an exemplary embodiment, the pads have a height $H_{pad}$ and two adjacent pads are spaced by a distance D, such that:

$H_{pad}/D<2$, and preferably $H_{pad}/D<1.5$. Preferably $H_{pad}/D<1$.

The distance D and the height $H_{pad}$ are referenced in FIG. 1d. According to an exemplary embodiment, the height $H_{pad}$ corresponds only to the thickness of the creep segment and to the thickness of the crystalline segment.

According to an exemplary embodiment, the crystalline layer is based on silicon. Preferably the crystalline layer is made of silicon. The crystalline layer can also be based on materials other than Si and which allow the epitaxy of nitride materials. For example, the crystalline layer can be based on SiC or $Al_2O_3$. These materials can further be used in the form of SiCOI (SiC on Insulator) or SOS (silicon on sapphire).

According to an exemplary embodiment, the crystalline layer is a monocrystalline layer.

According to an exemplary embodiment, the creep layer is in direct contact with the substrate. The creep layer is in direct contact with the crystalline layer. According to an exemplary embodiment, the nitride layer which is produced by coalescence of crystallites is in direct contact with the crystalline layer. According to another embodiment, at least one intermediate layer is provided between the crystalline layer and the nitride layer which is produced by coalescence of crystallites. This intermediate layer typically forms the buffer layer.

Thus, the creep layer and the crystalline layer are different. The creep layer has a glass transition temperature. It is therefore made of a glass transition material and has the behaviour of glass transition materials. Thus, the creep layer is not crystalline. It is made of a viscous or vitreous material, for example an oxide. The creep layer and the crystalline layer are not made of the same material.

According to an exemplary embodiment, the creep layer has a thickness $e_{220}$ of less than 500 nm ($10^{-9}$ metres). It is preferably comprised between 50 nm and 500 nm and preferably between 100 nm and 150 nm.

According to an exemplary embodiment, the crystalline layer has a thickness comprised between 2 nm ($10^{-9}$ metres) and 10 μm ($10^{-6}$ metres) and preferably between 5 nm and 500 nm and preferably between 10 nm and 50 nm.

According to an exemplary embodiment, a crystallite is grown by epitaxy on all said pads.

According to an exemplary embodiment, the ratio V/III of the flows in the epitaxy deposition reactor (the flows being for example measured in sccm) of said material comprising nitride (N) and at least one from gallium (Ga), Indium (In) and aluminium (Al) is comprised between 100 and 2000.

According to an exemplary embodiment, the ratio V/III of the flows of the material forming said nitride (N) layer and at least one from gallium (Ga), Indium (In) and aluminium (Al) is comprised between 300 and 500 and preferably between 380 and 420.

According to an exemplary embodiment, the nitride layer is made of gallium nitride (GaN). According to another embodiment, the nitride layer is based on gallium nitride (GaN) and further comprises aluminium (Al) and/or indium (In).

According to another embodiment, the material forming said nitride (N) layer is any one of: gallium nitride (GaN), indium nitride (InN), aluminium nitride (AlN), aluminium gallium nitride (AlGaN), indium gallium nitride (InGaN), aluminium gallium indium nitride (AlGaInN), aluminium indium nitride (AlInN), aluminium indium gallium nitride (AlInGaN).

According to another embodiment, the object of the present invention is a microelectronic device comprising a substrate surmounted by a plurality of pads, each pad comprising at least:
- a creep segment, having a glass transition temperature $T_{glass\ transition}$,
- a segment formed of a crystalline material.

The device also comprises a nitride (N) layer obtained from at least one of gallium (Ga), indium (In) and aluminium (Al), said layer being entirely supported by the pads.

The material of the creep segment and the material of said nitride layer are selected such that:

$$T_{epitaxy} \geq k1 \cdot T_{glass\ transition}, \text{ with } k1=0.8,$$

$T_{epitaxy}$ being the minimum temperature allowing the formation of the nitride layer by epitaxy.

According to a particularly advantageous example, k1=0.92. According to an even more preferred exemplary embodiment, k1=0.95. According to an even more preferred exemplary embodiment, k1=1, and preferably k1=1.5.

According to a particularly advantageous example, the nitride layer epitaxy growth step comprises:
- a first step using the first growth conditions selected so as to produce pyramids by epitaxy on each of the pads and until the pyramids adjoin;
- a second step, using second growth conditions selected so as to induce lateral growth in order to ensure the coalescence of the pyramids.

The growth conditions comprise parameters relating in particular to the pressure, the temperature and the ratio of the chemical species used for growth.

According to one example, the crystalline layer is not stressed. Its lattice parameter being equal to its nominal lattice parameter, that is to say its lattice parameter in the natural state.

According to another embodiment, the present invention relates to a light-emitting diode (LED) comprising at least one microelectronic device according to the invention.

Microelectronic device means any type of device produced with microelectronic means. These devices include in particular in addition to purely electronic devices, micro-mechanical or electromechanical devices (MEMS, NEMS . . . ) as well as optical or optoelectronic devices (MOEMS . . . )

BRIEF DESCRIPTION OF THE FIGURES

The purposes, objects, as well as the features and advantages of the invention will emerge better from the detailed description of embodiments of the latter which is illustrated by the following appended drawings wherein.

The figures are given by way of examples and are not limitative of the invention. They are principle schematic representations intended to facilitate the understanding of the invention and are therefore not necessarily on the same scale as the practical applications. Particularly, the relative thicknesses of the different layers, segments and crystallites are not representative of reality.

DETAILED DESCRIPTION OF THE INVENTION

It is specified that in the context of the present invention, the terms "on", "surmounts", "covers" or "underlying" or their equivalents do not mean "in contact with". Thus, for example, "depositing a first layer on a second layer" does not necessarily mean that the two layers are in direct contact with each other, but this means that the first layer at least partially covers the second layer by being either directly in contact therewith or by being separated therefrom by at least one other layer or at least one other element including air.

In the following description, the thickness or the height is taken in a direction perpendicular to the main faces of the different layers. In the figures, the thickness or the height is taken vertically.

Similarly, when indicating that an element is located in line with another element, this means that these two elements are both located on the same line perpendicular to the main plane of the substrate, that is to say on the same line oriented vertically on the figures.

A layer, "based" on a material A, means a layer comprising only this material A or comprising this material A and possibly other materials, for example doping elements In the following description, the terms crystals and crystallites will be considered as equivalent.

The general principle of the process according to the invention will now be described with reference to FIGS. 1a to 1e.

Figure 1A:
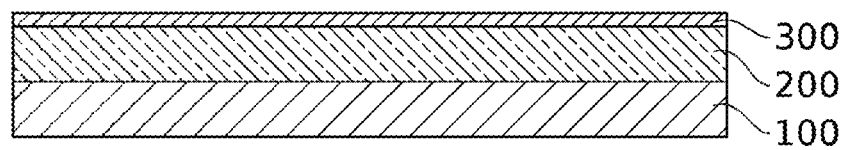
FIG. 1, composed of FIGS. 1a to 1e, illustrates steps of an exemplary process according to the present invention.

As illustrated in FIG. 1a, a stack is provided comprising at least one substrate 100, successively surmounted by a creep layer 200 and a crystalline layer 300. Thus the creep layer 200 is disposed between the substrate 100 and the crystalline layer 300.

According to an exemplary embodiment, the substrate 100 is based on amorphous or crystalline silicon. It ensures the mechanical strength of the stack.

The crystalline layer 300 has a lower face opposite the creep layer 200 and an upper face whose function is to serve as a base layer to epitaxially grow the nitride layer desired to be obtained in the end. For example, the layer desired to be obtained in the end is a layer 550 of gallium nitride GaN.

According to an exemplary embodiment, the crystalline layer 300 is based on monocrystalline silicon.

Preferably, the creep layer 200 is made of a viscous material. It is made of an amorphous material such as an oxide, preferably a silicon oxide SixOy, such as SiO2. The role of this layer will be explained in the following description.

The creep layer 200 has a glass transition temperature. Therefore, it has a glass transition and has the behaviour of glass transition materials. Like all materials with a glass transition temperature, the creep layer 200 under the effect of a rise in temperature, deforms without breaking and without returning to its initial position after a drop in temperature. On the contrary, the crystalline layer 300 naturally does not have a glass transition. When a temperature threshold is reached, the crystalline layer deforms, then dislocates and can break.

In an advantageous but non-limiting manner, this stack constitutes a substrate of the semiconductor on insulator type, preferably silicon on insulator (SOI). In this case, the creep layer 200 is formed by the buried oxide layer (BOX) of the SOI substrate.

Figure 1B:
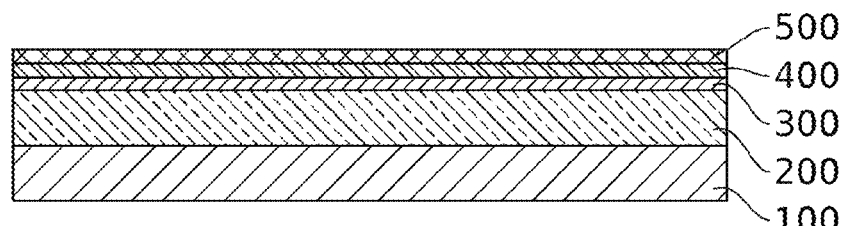

According to an advantageous exemplary embodiment illustrated in FIG. 1b, a buffer layer 400 is deposited by epitaxy on the upper face of the crystalline layer 300. When the layer 550 desired to be obtained in the end is a GaN layer and the crystalline layer 300 is a silicon-based layer, this buffer layer 400 is typically made of aluminium nitride (AlN). This allows to avoid the phenomenon called "Meltback etching", generated by the very high reactivity between silicon and gallium at the usual epitaxy temperatures (1000/1100° C.) and which leads to very strongly degrading the GaN layer.

Typically, the thickness of the AlN layer is comprised between 50 and 200 nanometres ($10^{-9}$ metres).

Consequently, the creep layer 200 and the crystalline layer 300 are different. The creep layer 200 is not crystalline.

As illustrated in FIG. 1b, a primer layer 500 can also be deposited by epitaxy, on the upper face of the buffer layer 400. This primer layer 500 has the function of facilitating the resumption of growth of the crystallites 510 during the following steps. In this case, it is from an upper face of the primer layer 500 that the growth of the crystallite (510a-510e) by epitaxy at least partially occurs. This primer layer 500 is preferably made of the same material as the layer 550 desired to be obtained in the end. Typically, when the layer desired to be obtained in the end is a layer 550 of gallium nitride GaN, the primer layer 500 is also made of GaN. Typically, it has a thickness comprised between 50 and 200 nanometres.

It will be noted that layers 400 and 500 are only optional.

According to embodiments not illustrated in FIG. 1, it is possible to provide only the buffer layer 400 or only the primer layer 500, or even none of these two layers 400 and 500.

Regardless of the embodiment selected, that is to say with or without primer layer 400 and with or without buffer layer 500, the growth by epitaxy of the crystallite 510a-510e, takes place at least in part or only from the upper face of the pad 1000a-1000e. Thus, this upper face is formed either by the crystalline segment 300a-300b, or by the segment formed by the primer layer 400a-400b, or by the segment formed by the buffer layer. This allows in particular to rapidly obtain crystallites of significant thickness.

It will be noted that the upper faces of the buffer layer 400 and the primer layer 500, that is to say the faces opposite the nitride layer 550 desired to be grown, have polarities of Gallium (Ga), and not nitrogen (N) type, which considerably facilitates the production of a high-quality epitaxial nitride layer 550.

Figure 1C:
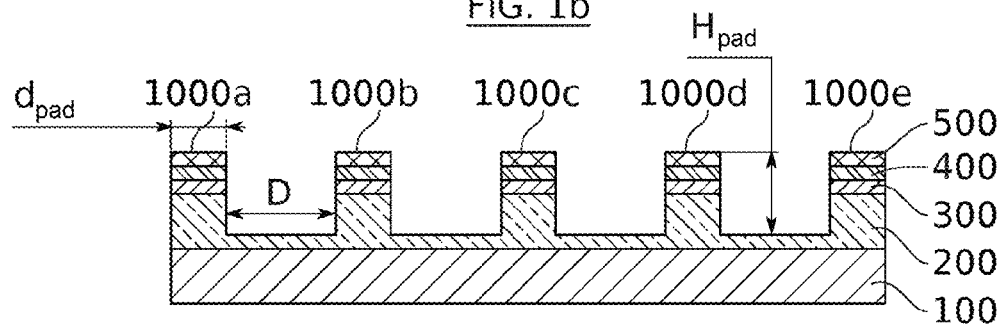

As illustrated in FIG. 1c, pads 1000a-1000e are formed from the stack. These pads are obtained by etching the stack into the creep layer 200.

To form the pads by etching, numerous etching techniques known to the person skilled in the art can be used. In particular, conventional lithography techniques can be used, such as photolithography techniques comprising the formation of a mask, for example made of resin, and then the transfer of the patterns of the mask into the stack. E-beam lithography techniques or nanometric printing techniques can also be used.

These pads 1000a-1000e are small and can be called nano-pads. Typically, the maximum dimension of the section of the pads is comprised between a few tens and a few hundred nanometres, more precisely between 10 and 500 nanometres and preferably 100 nm. This maximum dimension of the section of the pads is referenced $d_{pad}$ in FIG. 1c. If the pads are of circular sections, this maximum dimension $d_{pad}$ corresponds to the diameter of the pads. If the pads are of hexagonal section, this maximum dimension $d_{pad}$ corresponds to the diagonal or to the diameter of the circle passing through the angles of the hexagon.

According to an exemplary embodiment, the segments have a height e220 and two adjacent pads are spaced by a distance D, such that:

$e220/D<1$, and preferably $e220/D<1.5$. Preferably $e220/D<2$.

According to an exemplary embodiment, the pads have a height $H_{pad}$ and two adjacent pads are spaced by a distance D, such that:

$H_{pad}/D<2$, and preferably $H_{pad}/D<1.5$. Preferably $H_{pad}/D \leq 1$.

Figure 1D:
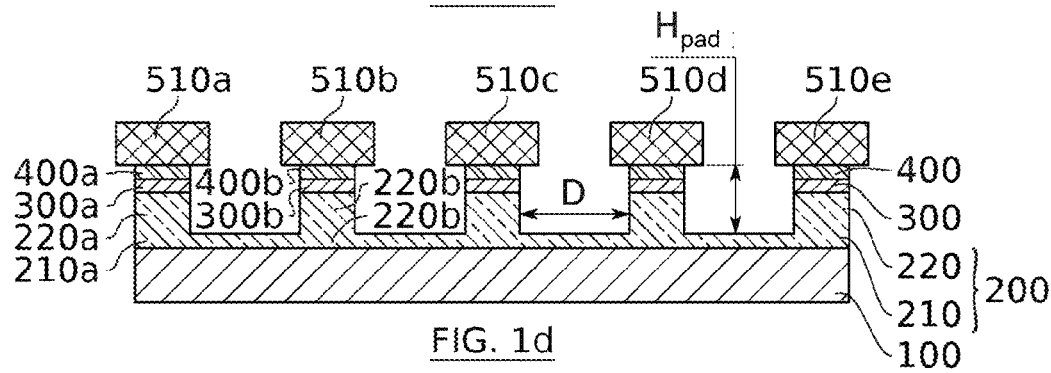

The distance D and the height $H_{pad}$ are referenced in FIG. 1d.

As illustrated in FIG. 1c, the pads are etched through the entire primer layer 500, the entire buffer layer 400 (when the latter are present), the entire crystalline layer 300. Preferably, only a portion 220 of the creep layer 200 is etched. This embodiment has the advantage of avoiding that during epitaxy the nitride layer 550 develops on the creep segments 220. This selectivity of epitaxy is encountered in particular when the nitride layer 550 which is grown by epitaxy is GaN and the creep segments are in SiO2. On the contrary, if, with these same materials, the creep layer 200 is etched over its entire thickness, then during epitaxy, the nitride layer develops from the upper face of the substrate 100, usually formed of silicon. This situation is obviously not desirable Furthermore, it has been observed that the fact of keeping an unetched portion 210 of the creep layer 200 allows to facilitate the creeping of the segment 220, particularly when the crystallites are disoriented in twist, that is to say in the plane of the nitride layer 550 desired to be obtained.

Preferably, the etched thickness e220, and therefore forming the height of the creep segment 220, is equal to half the thickness of the creep layer 200. This allows to have a very good reorientation of the crystallites during the formation of grain joints.

FIG. 1d illustrates the formation of crystallites 510a-510e by epitaxial growth from the primer layer 500 (or from the upper face of the crystalline layer 300 when the layers 400 and 500 are absent).

As illustrated in this FIG. 1d, the pads 1000a-1000e each comprise a crystallite 510a-510e carried by a stack of segments 400a-400e, 300a-300e, 220a-220e. The segments extend in the main direction of extension of the pad, that is to say vertically in FIGS. 1a to 1e.

The segments form discs if the section of the pads is mainly circular. If the section of the pads 1000a-1000e is polygonal, for example hexagonal, the segments then form cylinders of hexagonal section. Preferably, the segments are full. In other words, and as clearly illustrated in the figures, the section of the pads is taken along a plane parallel to the planes wherein the creep layer 220 and the crystalline layer 300 mainly extend. Thus, this section is taken along a plane perpendicular to the plane of the sheet comprising FIGS. 1a to 1e and along a plane parallel to the plane of the sheet comprising FIGS. 2a and 2b.

Figure 1E:
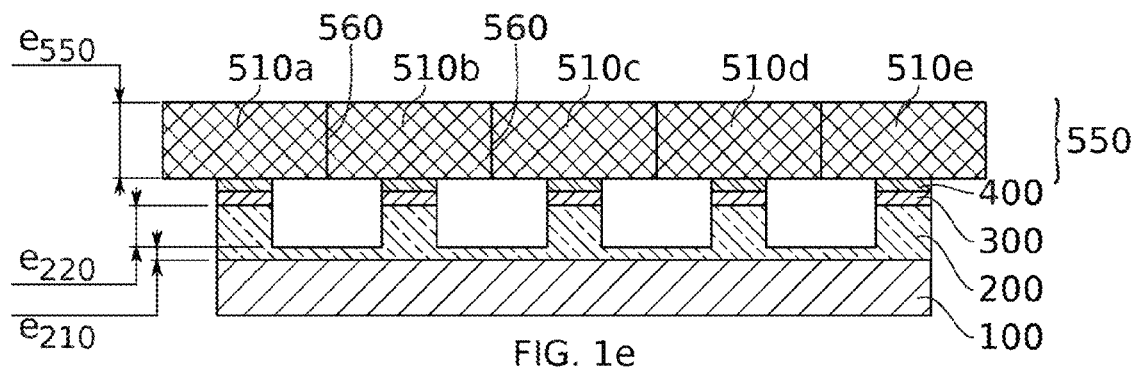

The growth continues and extends laterally. The crystallites 510a-510e develop until they coalesce and form a layer 550 as illustrated in FIG. 1e.

In other words, and as clearly appears from the figures, the layer 550 extends between several pads. It is continuous.

This growth of crystallites 510a-510e does not extend downward. Moreover, this growth is selective in that it does not take place on the creep layer 200 typically made of an oxide. In this sense, the growth of the crystallites 510a-510e takes place according to the principle of pendeo-epitaxy.

It will be noted that it is particularly advantageous to etch the pads 1000a-1000e after formation by epitaxy of the buffer layer 400 and the primer layer 500 (when these layers are present). Indeed, if one of these layers 400, 500 was deposited after etching, it would partly be formed at least between the pads 1000a-1000e on the upper face of the creep layer 200. In the case where the nitride layer 550 is GaN, the creep layer 200 is $SiO_2$, then, at the epitaxy deposition temperature, the epitaxial growth of the layer 550 would not take place selectively but would on the contrary also take place between the pads 1000a-1000e, which of course is not desirable.

In a particularly advantageous manner, the temperature $T_{epitaxy}$ at which the epitaxy is carried out is greater than or of the order of the glass transition temperature $T_{glass\ transition}$ of the creep layer 200. Thus, during epitaxy, the creep segments 220a-220e are brought to a temperature which allows them to deform.

Consequently, if the crystallites 510a-510b carried by two adjacent pads 1000a-1000b are disoriented relative to each other, during the coalescence of these two crystallites, the joint 560 formed at their interface, usually designated grain joint or coalescence joint, will be formed without dislocation to make up for these disorientations. The deformation of the creep segments 220a-220e thus allows to make up for these disorientations.

Figure 2A:
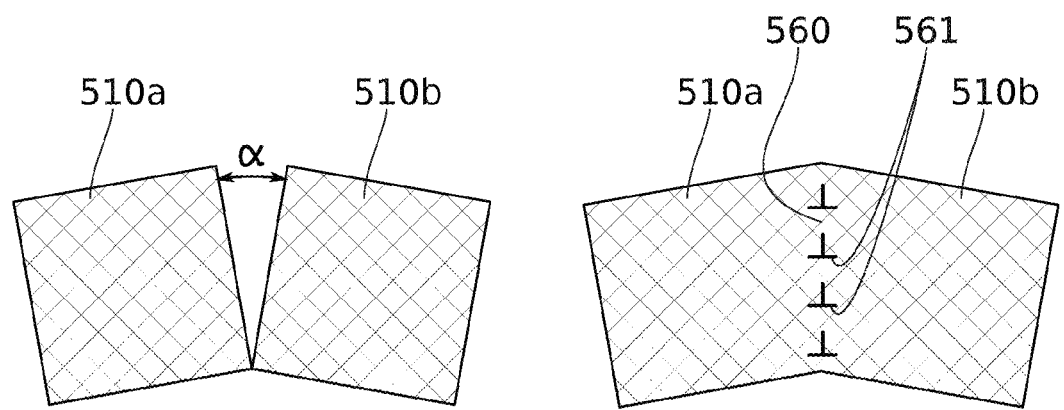
FIG. 2a schematically illustrates, in top view, the coalescence of two crystallites in the context of a conventional pendeo-epitaxy process.
Figure 2B:
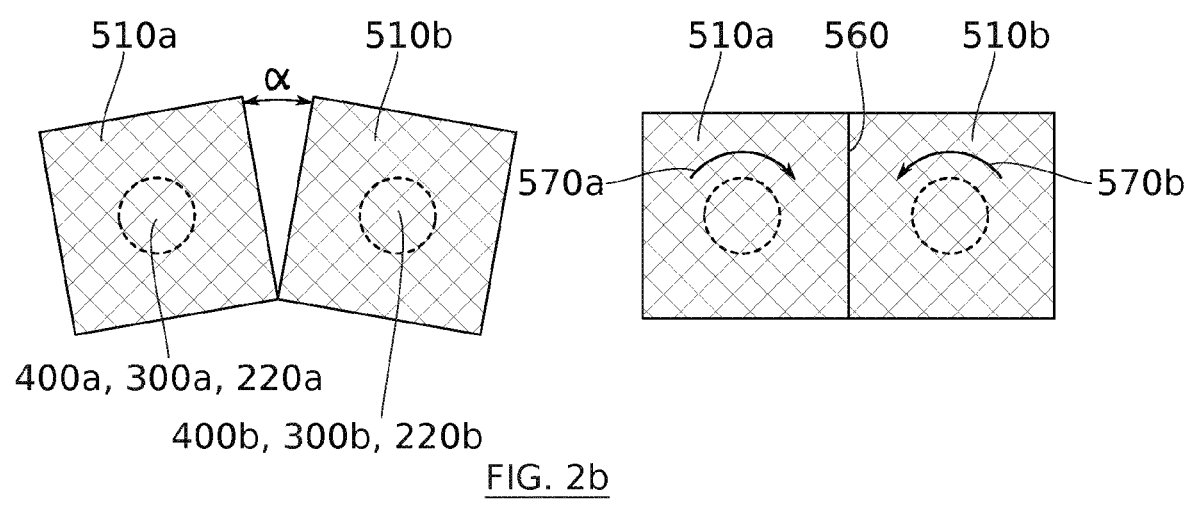
FIG. 2b schematically illustrates, in top view, the coalescence of two crystallites in the context of an exemplary process according to the present invention.

As illustrated in FIGS. 2a and 2b, the disorientation of the two crystallites 510a-510b can result from a misalignment in the plane (that is to say around axes contained in the plane of FIGS. 1a-1e), this is referred to as twist.

FIG. 2a, which shows a top view of the crystallites 510a-510b, illustrates this type of misalignment with the presence of an angle α between the crystallites. This FIG. 2a schematically illustrates that, with the conventional processes, the joint 560 which is formed during the coalescence creates dislocations 561 to compensate for the misalignments.

FIG. 2b very schematically illustrates the formation of the coalescence joint 560 by implementing the process according to the invention. This FIG. 2b shows the twist deformation 570a, 570b of the creep segments 220a, 220b allowing to form a coalescence joint 560 without dislocation. In this case, making up for this deformation by the creep segments 220a-220b leads to a twist of the creep segments 220a-220b around their main axis. Each segment rotates in an opposite direction as illustrated in the right view of FIG. 2b.

Figure 3A:
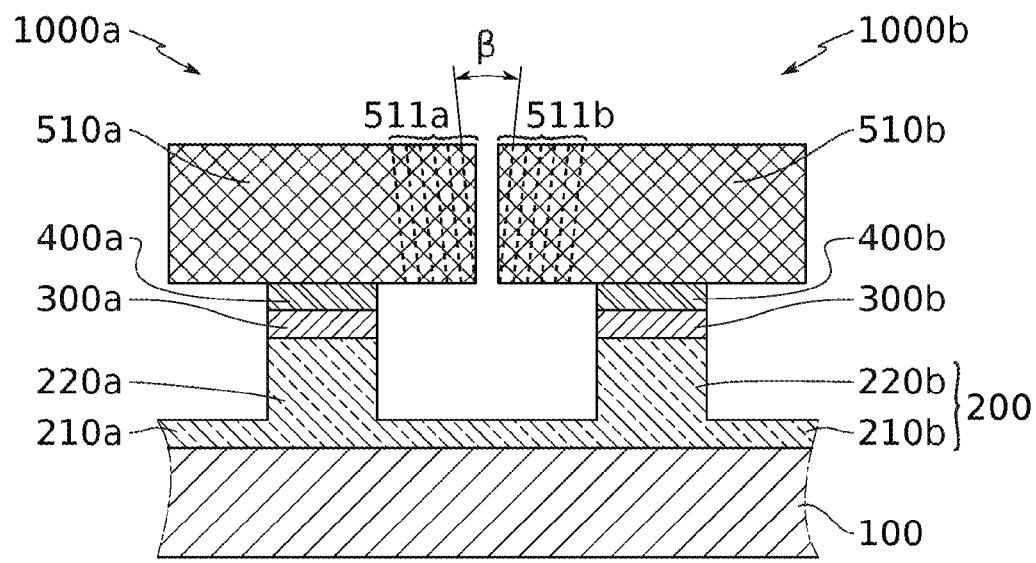
FIG. 3, composed of FIGS. 3a and 3b schematically illustrate, in side view, the coalescence of two crystallites in the context of an exemplary process according to the present invention.
Figure 3B:
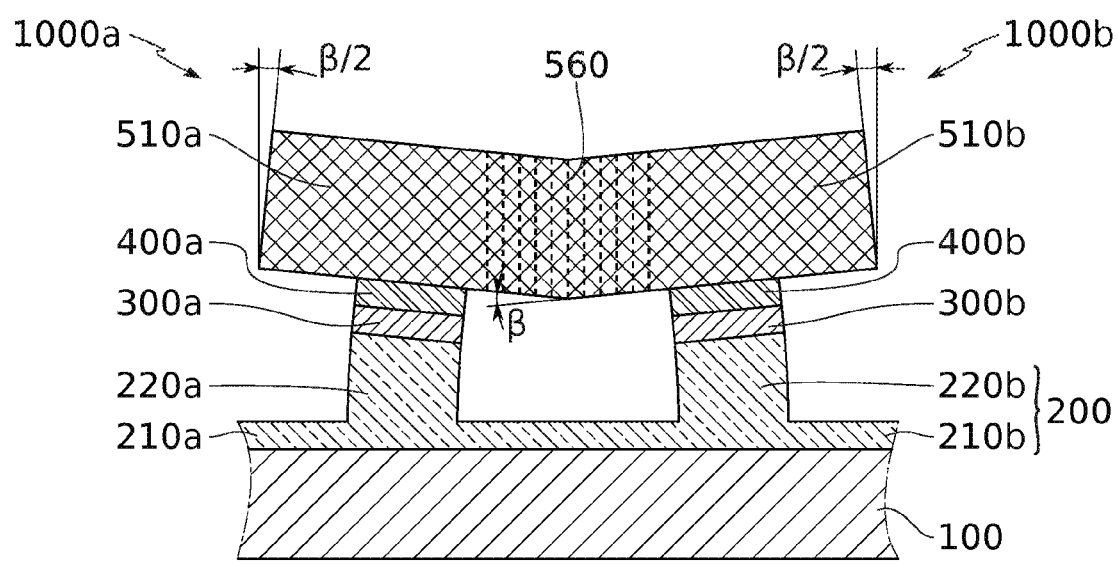

As illustrated in FIGS. 3a and 3b, the defect in orientation of the two crystallites can also result from a misalignment out of the plane (that is to say around axes perpendicular to the plane of FIGS. 1a-1e), this is referred to as tilt. In this case, making up for this deformation by the creep segments 220a-220e leads to a tilting of the pads.

FIG. 3a illustrates by the angle β the defect of angular orientation between the crystalline planes of the crystallites 510a and 510b before coalescence. FIG. 3b very schematically illustrates the deformation of the creep segment 220 allowing to form a coalescence joint 560 without dislocation. It has been assumed in this diagram that the disorientation is distributed equally between the two crystallites 510a and 510b, that is to say β/2. The diagram is also applicable in the case where the crystalline disorientations are different in angle in the two adjacent crystallites and whose sum is equal to β.

FIGS. 2 and 3 are not intended to give a visual representation close to reality concerning the deformation of the creep segments. These figures are intended to give a schematic representation to easily understand the operating principle of the invention.

The following paragraphs are intended to provide additional explanations and details regarding the principle of operation of the invention.

Modelling and Explanation of the Principle of the Invention

The paragraphs below aim at explaining more precisely the phenomena at the origin of the invention and which allow to obtain an epitaxial layer without or with very little dislocation.

When two grains or crystallites are rigidly linked to the substrate on which they have been deposited and are slightly disoriented relative to each other, the energy of formation of their coalescence joint is high (the energy can be fairly easily calculated since it is a first approximation of a network of interfacial dislocations. For this purpose, reference can be made to the following publication: J. P. Hirth and J. Lothe "Theory of dislocations", John Wiley and sons (1982).

On the other hand, if the crystallites 510 rest on pads 1000a-1000e as is the case in pendeo-epitaxy, and these pads 1000a-1000e can be deformed, by twisting or tilting, the disorientation of the crystallites 510 (for example GaN) relative to each other is "transmitted" to the pads carrying these crystallites 510. In the case of a simple twist, as illustrated in FIG. 2b, the phenomenon can be modelled by saying that the attractive forces which cause the crystallites to rotate to join and form an "internal" surface result in a twisting torque at the nano-pads 1000a-1000e. This twisting torque will be even greater as the ratio between the size of the pads 1000a-1000e and the size of the crystallites is small. If the deformation of the pads 1000a-1000e is easy, the coalescence joint 560 then simply transforms into an internal surface for which the "perfect" atomic bonds will be formed. Energetically speaking, this will only be possible if the energy released during coalescence by the formation of an "internal surface" is greater than the energy that must be spent so that the pads 1000a-1000e themselves deform to absorb the initial disorientations between the adjacent crystallites 510a-510b. The fact that the underlying pad is a pedestal made of SiO2 is favourable since SiO2 creeps at the growth temperature. SiO2 is a material which is effectively well adapted for this process, but this does not exclude the use of other materials, such as glasses which can creep at equivalent or lower temperatures, such as borosilicate glasses or borophosphosilicate glasses (BPSG), also used for the manufacture of SOI.

In the case of GaN crystallites of hypothetically cubic shape and of 500 nm side, carried by pads of circular section of 100 nm diameter, the energy released during coalescence can be expressed as the difference between the internal cohesion energy and the surface energies of the two surfaces which will be contacted. The surface energy values are of the order of 0.1 to 0.2 eV/Angström$^2$ (for this purpose reference can be made to the following publication: C. E. Dreyer, A. Janotti, and C. G. Van de Walle "Absolute surface energies of polar and nonpolar planes of GaN", PHYSICAL REVIEW B 89, 081305(R) 2014). The cohesion energies are, in turn, in the order of 11 eV (Ga—N bond).

As a first approximation, starting from a hexagonal surface (type 0001) a value of 36 eV per unit cell (three Ga—N bonds per unit cell) is obtained, namely, for the hexagonal unit cell considered (surface 26 A$^2$), an energy of cohesion per surface of 1.35 eV/Angstrom$^2$. The approach was simplified by considering surfaces to be contacted of type c (0001), but the corrections related to the crystal orientation of these surfaces (number of bonds per unit cell and surface energies) are of the second order and only slightly modify this numerical evaluation.

Then a "released" energy (final state–initial state) upon contacting by forming covalent bonds of 1.35−0.3=1.05, or about 1 eV per Angström$^2$, is obtained. This is obviously independent of the disorientation between the crystallites 510 to be contacted. If crystallites of a cubic shape (to simplify the estimation as in the diagrams in FIG. 2b) and of 500 nm side are considered, then a released energy of 25 $10^E$6×1.6 $10^E$-19, or of the order of 4 $10^E$-12 Joules, is obtained. This is to be compared to the energy required to deform the pads 1000a-1000e made of SiO2 under the crystallites as will be detailed below.

At the GaN epitaxy temperature (about 1100° C.), the silicon oxide has a visco-plastic behaviour with a viscosity which depends on both the temperature and the mechanical stress undergone by the material.

As the temperature increases, the viscosity of SiO2 decreases, like any material having a glass transition. Above a certain stress, the viscosity of SiO2 also decreases when the mechanical stress increases. In other words, unlike a conventional fluid wherein the plastic deformation rate is proportional to the shear stresses (viscosity independent of the stress), beyond a threshold value called breaking stress, the SiO2 deformation rate increases exponentially with stress. In practice, at 1100° C., the SiO2 breaking stress is around 500 MPa: at this temperature, the viscosity of SiO2 is therefore independent of the stress up to stresses of 500 MPa. Beyond this, the viscosity drops by several orders of magnitude and a very rapid plastic deformation then gives a residual stress close to the ultimate stress. This residual stress then decreases much more slowly by conventional creep (several minutes to several hours).

Before alignment, the GaN crystallites 510 have a disorientation relative to each other of an average of 1 to 6°. Before the neighbouring crystallites are bonded together to form covalent atomic bonds, the interatomic forces acting between the crystallites are the Van der Waals forces which are attractive at very short range. This results in the existence of a rotational torque applied to the contact point to align them. After a very slight rotation of a fraction of a degree, the breaking stress of 500 MPa is reached in the creep segment 220a-220e under the pads 1000a-1000e. Creep then becomes almost instantaneous in the oxide and the rotational torque required for rotation is constant during the end of the alignment phase.

If the geometry of FIG. 2b is used again, i.e. a crystallite 510a-510b of cubic shape of 500 nm side and centred on a pad 1000a-1000b of smaller circular section of 100 nm side. The complete coalescence of the crystallites 510 is carried out in typically a few hundred seconds. If 1 s is taken as the characteristic time for contacting the crystallites 510, a numerical model shows that to turn the pad by 2° in about one second, a mechanical work of the order of $0.5^E$-20 to $1^E$-20 Joules must be provided, taking into account the failure of the oxide at high temperature. The energy released by contacting the two surfaces, of the order of $10^E$-11 to $10^E$-13 Joules, is therefore very much greater than the mechanical energy of deformation of the underlying pads 1000a-1000e. This energy is also of several orders of magnitude smaller than that which would have been necessary to align the pads constructed on solid silicon (bulk) or to align the pads formed by a material having no glass transition phase around the temperature of epitaxial growth of crystallites 510.

The considerations in the above paragraphs show that to obtain coalescence of the crystallites without dislocation, the following parameters can be adjusted:

The "mechanical fracture" properties of the material forming the creep segment at high temperature under relatively low stresses of 500 MPa.

The sufficiently small size of the support pad 1000a-1000b compared to the distance D between the pads, allows to create a stress in the creep segment which is, for a given rotational torque, greater than the ultimate stress.

Moreover, as indicated above, it will be ensured that the epitaxy temperature $T_{epitaxy}$ makes the creep of the creep segment 220a-220b possible. In practice, $T_{epitaxy} \geq 600°$ C. (in the context of molecular beam epitaxy), $T_{epitaxy} \geq 900°$ C. and preferably $T_{epitaxy} \geq 1000°$ C. and preferably $T_{epitaxy} \geq 1100°$ C. These values allow to reduce in a particularly effective manner the defects in the epitaxial layer when the creep layer is made of SiO2. In practice, $T_{epitaxy} \leq 1500°$ C.

In order to facilitate the formation of coalescence joints 560 without dislocation, it will be preferable to apply the following conditions:

$$T_{epitaxy} \geq k1 \cdot T_{glass\ transition},\ \text{with } k1=0.8, \text{preferably}$$
$$k1=1\ \text{and preferably } k1=1.5.$$

According to an exemplary embodiment, $T_{epitaxy} \leq k2 \cdot T_{melting\ min}$, $T_{melting\ min}$ being the lowest melting temperature among the melting temperatures of the segments forming the pad. This is mainly the crystalline segment and the creep segment. According to an exemplary embodiment, k2=0.9. This allows to avoid a diffusion of the species of material with the lowest melting temperature.

Thus, in the case where the pad is formed of SiO2 creep segments and of silicon crystalline segments, $T_{epitaxy} \leq 1296°$ C. Indeed, $T_{melting\ min}$ is equal to the melting temperature of silicon since the melting temperature of silicon is equal to 1440° and the melting temperature of SiO2 is equal to 1970° C.

According to an exemplary embodiment, the height $e_{220}$ of the creep segment is such that $e220 \geq 0.017\ d_{pad}$. Preferably, $e220 \geq 0.05\ d_{pad}$. Preferably, $e220 \geq 0.1\ d_{pad}$. Preferably, $e220 \geq 1\ d_{pad}$. These values, allow to obtain sufficient deformation to reduce the stresses at the grain joint.

The pads 1000a-1000e have a height $H_{pad}$, and two adjacent pads 1000a-1000e are spaced by a distance D, such that: $H_{pad}/D<2$ and preferably $H_{pad}/D\leq 1$.

Advantageously, the step of forming the pads 1000a-1000e is carried out so that $d_{crystallite}/d_{pad}\geq k3$, $d_{pad}$ being the maximum dimension of the section of the pad 1000a-1000e taken in a direction parallel to a main plane wherein the substrate 100 extends. $d_{crystallite}$ corresponding to the dimension of the crystallite measured in the same direction as $d_{pad}$ at the time of the coalescence of the crystallites 510a-510e.

According to an example $100\geq k3\geq 1.1$. Preferably, $50\leq k3\geq 1.5$. Preferably, $5\geq k3\geq 2$.

According to an example $k3\geq 3$, preferably $100\geq k3\geq 3$. Preferably $50\geq k3\geq 3$. Preferably $5\geq k3\geq 3$.

This feature allows the creep segments to deform in order to absorb in a particularly effective manner the mechanical stresses which arise when two adjacent crystallites begin to coalesce. Thus, this feature effectively contributes to reducing the density of defects within the nitride layer obtained in the end.

Exemplary Embodiments

Figure 4:
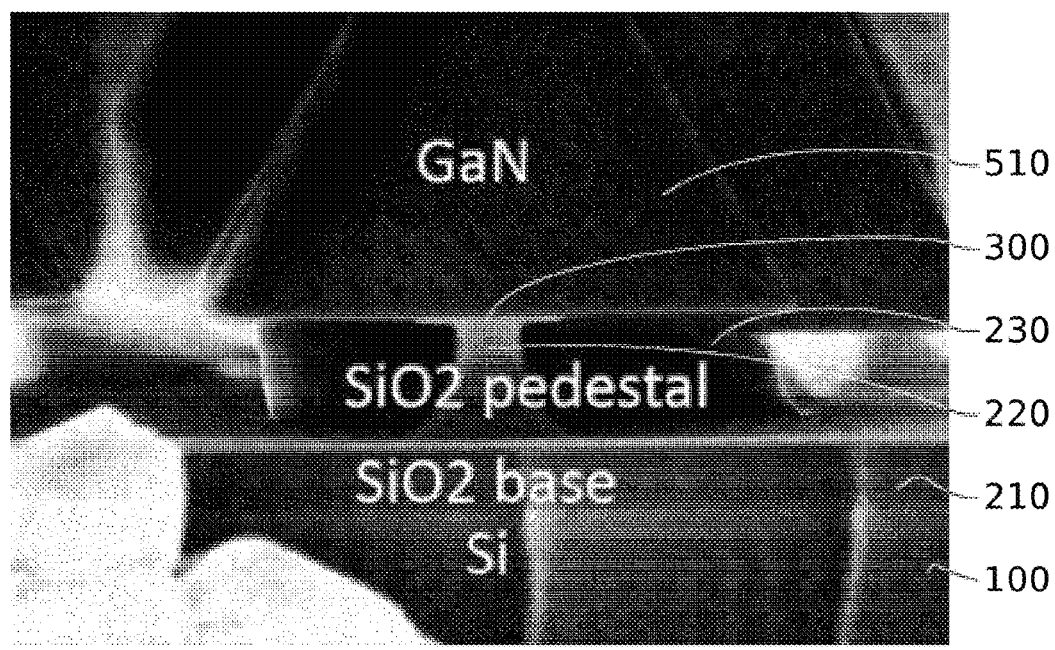
FIG. 4 is a photo illustrating a pad surmounted by a crystallite, obtained by implementing an exemplary process according to the present invention.

FIG. 4 is a photo taken with a scanning electron microscope (SEM). It allows to see a stack comprising successively the substrate 100, the unetched portion 210 of the creep layer, the creep segment 220, the crystalline layer 300 as well as a crystallite 510, here made of GaN. This crystallite 510 is pyramidal in shape due to the lower growth rate of the semi-polar planes which form the facets of the pyramid. In this example, the size of the pad is 100 nm.

Empty spaces 230 can be seen on either side of the creep segment 220.

To ensure the coalescence of the pyramids and obtain two-dimensional growth, it may be advantageous to proceed as follows. In a first step, pyramids are made on each of the nano-pads 1000a-1000e using given growth conditions until the pyramids adjoin. In a second step, these growth conditions are modified to induce lateral growth. This two-step growth procedure is for example described in the following publication: Shields and al. 2011, Nanopendeo coalescence overgrowth of GaN on etched nanorod array Phys. Status Solidi C 8, No. 7-8, 2334-2336 (2011).

Figure 5A:
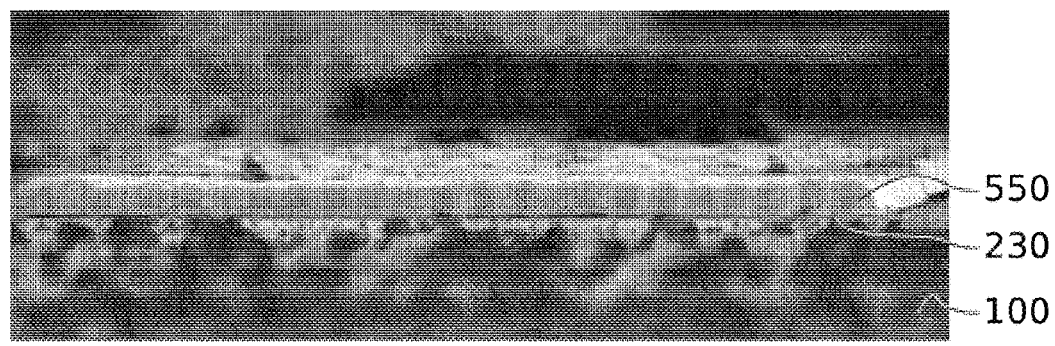
FIG. 5 is composed of FIGS. 5a and 5b which are photos showing a layer obtained by epitaxy after implementing the process according to the present invention.
Figure 5B:
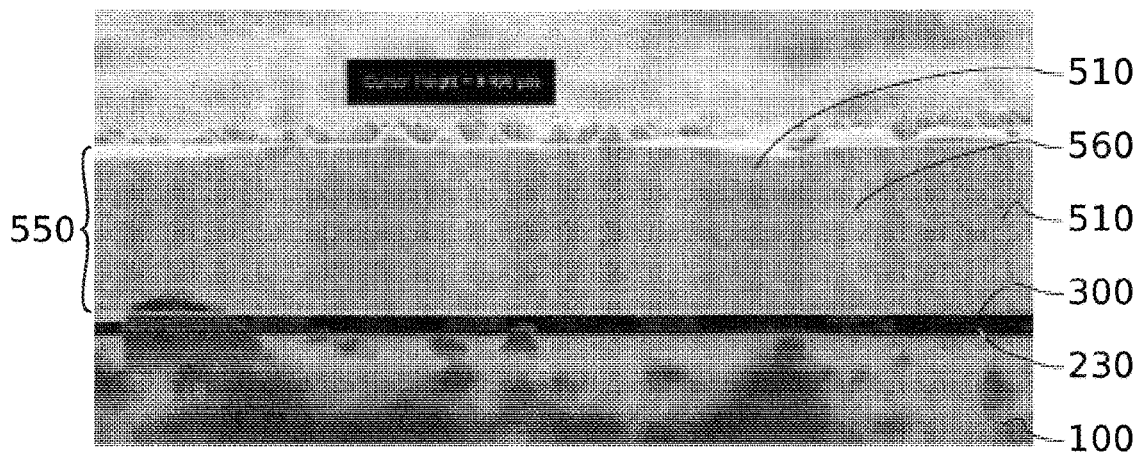
Figure 6A:
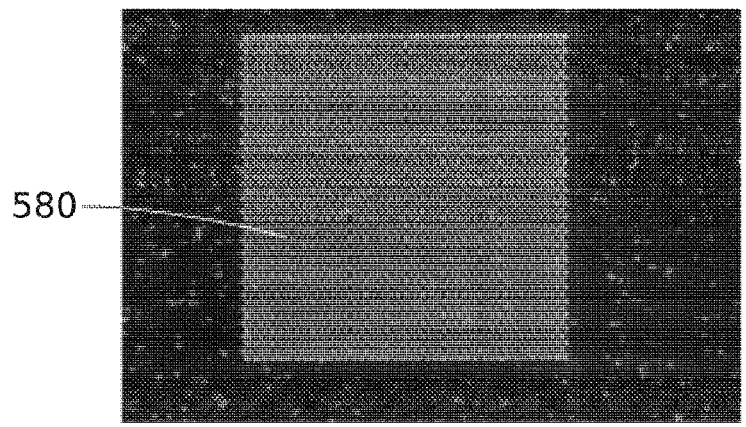
FIG. 6 is composed of FIGS. 6a to 6c which are photos illustrating the result of the implementation of an exemplary process according to the present invention.
Figure 6B:
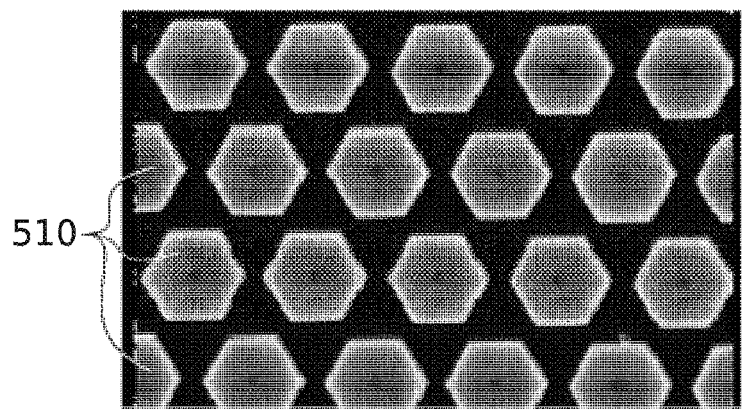
Figure 6C:
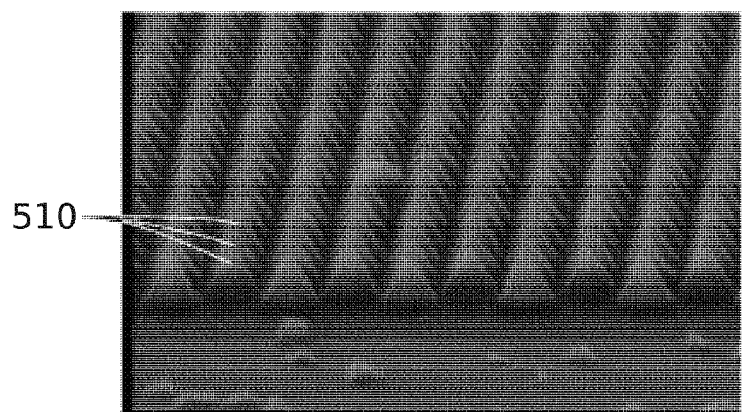
Figure 7A:
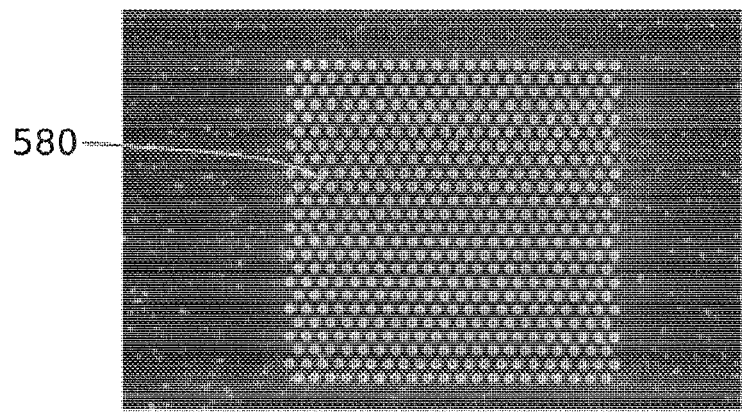
FIG. 7 is composed of FIGS. 7a to 7c which are photos illustrating the result of the implementation of an exemplary process according to the present invention.
Figure 7B:
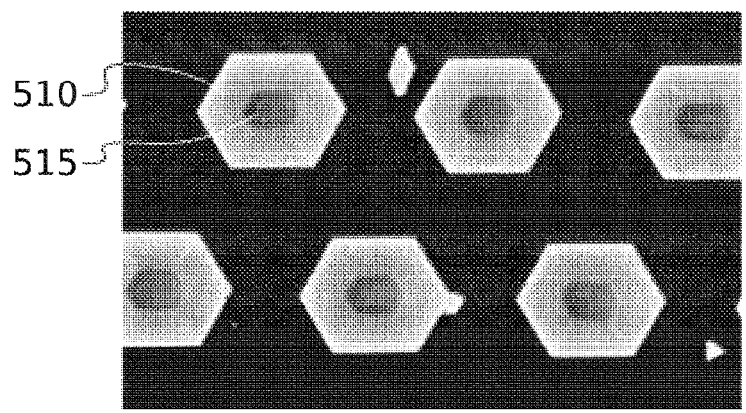
Figure 7C:
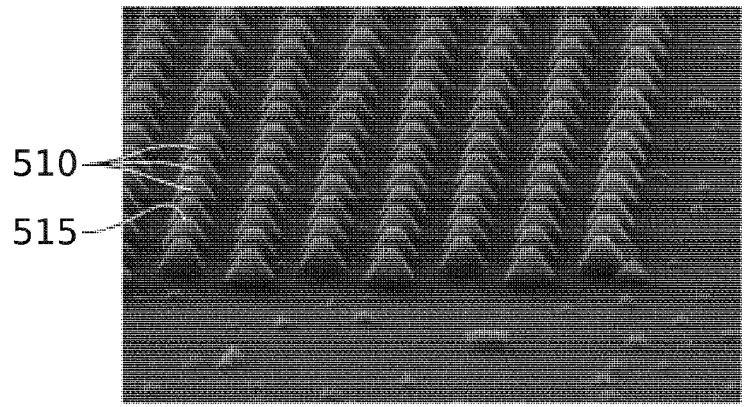

FIGS. 5a and 5b give examples of a layer 550 obtained according to this process for a matrix of 40×50 pads. In this example, the size of the pads is of 500 nm and their pitch is of 1 µm. This pad dimension allows to very significantly reduce the number of dislocations appearing on the crystallite of a pad. Moreover, this pad size allows to optimise the deformation and the transmission of the torque during coalescence.

In a particularly advantageous manner, it is clearly observed that the layer 550 has separated from the underlying substrate 100. Delamination of the layer 550 desired to be obtained in the end is therefore particularly easy. This automatic delamination can be complete or partial. It will be described in more detail below.

It is thus possible to produce self-supported GaN plates (or templates or platforms), in this example of size 40×50 µm.

It is in particular possible to adapt the number of pads and the period so that the size of these plates is compatible with the manufacture of diodes with specific dimensions and which can be very easily transferred to any type of support (electrical/thermal conductor/optical reflector . . . ).

In these FIGS. 5a and 5b, it is also noted that the coalescence joints 560 form without dislocation and that no dislocation is present at the crystallites 510.

FIGS. 6a to 6c and 7a to 7c are photos showing matrices 580 of GaN crystallites 510 forming pyramids and obtained after growth on the pads. The pads were produced by electron beam lithography (e-beam) from a stack comprising the following layers:
creep layer 200: SiO2
crystalline layer 300: Si
buffer layer 400: AlN
primer layer 500: GaN In the example illustrated in FIGS. 6a to 6c, the pads have a diameter of 200 nm and are spaced by 1 µm apart. In the example illustrated in FIGS. 7a to 7c, the pads have a diameter of 500 nm and are spaced by 2 µm apart. The top of the crystallites 510 is flat in this example. This top is referenced 515 in the figures.

Characterisations of Coalescence Defects

Figure 8A:
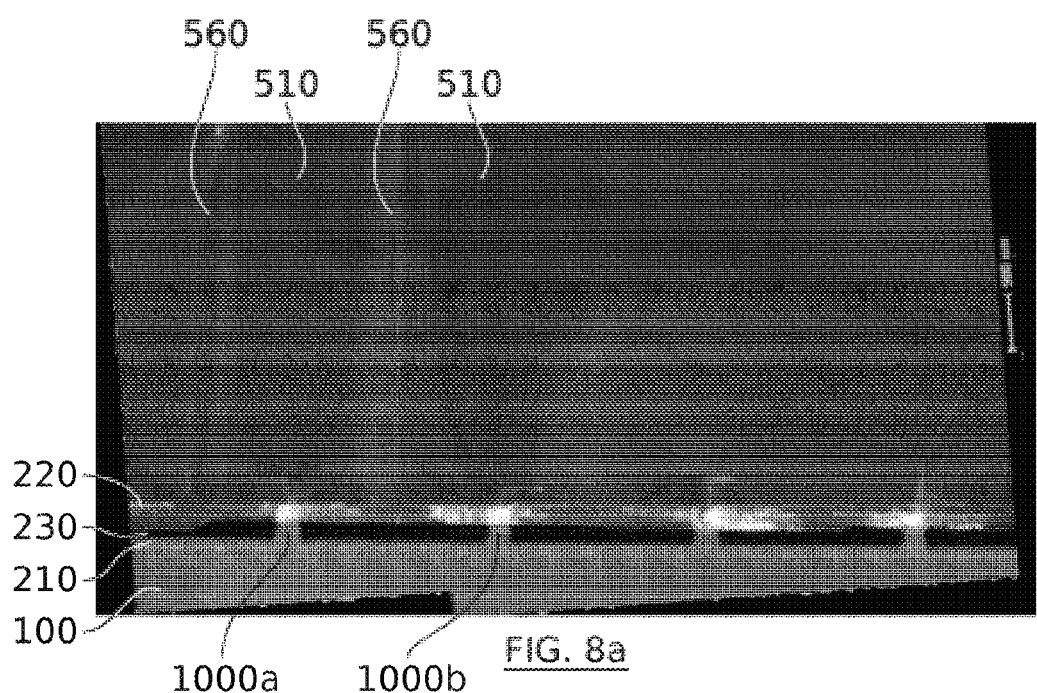
FIG. 8 is composed of FIGS. 8a to 8b which are photos illustrating respectively, in sectional side view and in top view, the result of the implementation of an exemplary process according to the present invention.

FIG. 8a is a photo taken with a transmission electron microscope (TEM) of a section of GaN crystals 510 having coalesced. In this figure, first of all it is noticed that most of the dislocations 561 resulting from re-growth are aligned in the growth plan at the start of growth.

Moreover, it clearly appears that the coalescence of the crystallites 510 coming from adjacent pads is done with very few coalescence defects at the coalescence joint 560. This is to be compared with the conventional methods for which the coalescence generates threading defects, that these conventional methods are based on a lateral overgrowth illustrated in FIG. 9 and as described in the publication E B Yakimov and A. Y Polyakov, 2015 Ebic investigation of dislocations in FLOG GaN, Phys. Status Solidi, or that they are based on a pendeo type overgrowth from one-dimensional structures as described in the publication mentioned above Shields and Al. 2011, Nanopendeo coalescence overgrowth of GaN on etched nanorod array Phys. Status Solidi C 8, No. 7-8, 2334-2336 (2011).

It is also noted in FIG. 8a that the pads 1000a-1000e, at half their height, are split, which will allow easy delamination of the epitaxial layer 550 on the matrices 580 of 1000a-1000e, to make templates or pseudo-substrates for the subsequent overgrowth of active layers, as explained above.

One possible interpretation is that this cracking of the pads 1000a-1000e is due to plastic deformation (under the effect of the twisting stresses of the pads 1000a-1000e) when the crystallites 510 coalesce at the epitaxial growth temperature. As indicated above, this decoupling of the epitaxial layer 550 relative to the substrate 100 during growth is a considerable advantage since no curvature of the plates thus formed is possible when cooling.

Figure 8B:
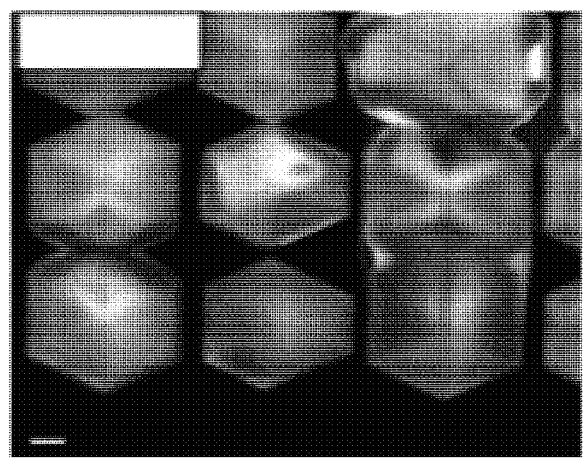

FIG. 8b confirms the absence of defects in the coalescence between two crystals, for example of pyramidal shape, using the cathodoluminescence technique. This technique allows performing spatial mapping of the emission of photons by the considered material. The image of panchromatic cathodoluminescence in FIG. 8b shows that, apart from the emission variations related to the extraction of light from different facets (or ridges), at the connection between two crystals, there is no non-radiative re-combinations, which demonstrates the absence of structural defects in the region of the coalescence joint.

In view of the above description, it clearly appears that the present invention provides a particularly effective solution for reducing the density of defects in a layer of epitaxial nitride, in particular from pads etched in a stack of SOI type.

The invention is not limited to the embodiments described above and extends to all the embodiments covered by the claims.

The invention claimed is:

1. A process for obtaining a nitride (N) layer optionally obtained from gallium (Ga), indium (In), and/or aluminum (Al), the process comprising:
on a stack comprising a substrate and, successively disposed from the substrate, a first layer, as a creep layer comprising a material having a glass transition temperature, $T_{glass\ transition}$, and a second layer, as a crystalline layer, which is crystalline and different from the creep layer, forming pads by etching at least the crystalline layer and at least a portion of the creep layer so that: (i) each pad comprises: (i-a) a first segment, as a creep segment, formed by at least a portion of the creep layer; and (i-b) a second crystalline segment, as a crystalline segment, formed by the crystalline layer and surmounting the creep segment; and each pad comprises a section whose maximum dimension is in a range of from 10 to 500 nm; and
growing by epitaxy a crystallite on at least some of the pads and continuing the epitaxial growth of crystallites at least until coalescence of the crystallites carried by two adjacent pads, so as to form the nitride layer,
wherein the growing by epitaxy is carried out at a temperature $T_{epitaxy}$, corresponding to formula (1):

$$T_{epitaxy} \geq k1 \times T_{glass\ transition} \quad (1),$$

wherein $k1 \geq 0.8$.

2. The process of claim 1, wherein the creep layer comprises:
a silicon oxide $Si_xO_y$, x and y being integers;
a glass;
a borosilicate glass; or
a borophosphosilicate glass (BPSG).

3. The process of claim 1, wherein $k1 \geq 1$.

4. The process of claim 1, wherein $$T_{epitaxy} \geq k2 \times T_{melting\ min} \quad (2),$$

wherein $T_{melting\ min}$ is a lowest melting temperature among melting temperatures of the segments forming the pad, and $k2 \leq 0.9$.

5. The process of claim 1, wherein the stack comprises, before the forming of the pads by etching, a priming layer, surmounting the crystalline layer,
wherein the priming layer comprises the same material as the nitride layer.

6. The process of claim 1, wherein, prior to the forming, the stack comprises an elaborate substrate of silicon on insulator (SOI) type comprising a base substrate surmounted successively by an oxide layer forming the creep layer and a semiconductor layer forming the crystalline layer.

7. The process of claim 1, wherein the creep segment has a height $e_{220}$ conforming to formula (3)

$$e_{220} \geq 0.1 \times d_{pad} \quad (3),$$

wherein dpad is a diameter of the pad or more generally a distance edge to edge of the pad taken, at the creep segment and in a direction parallel to a main plane wherein the substrate extends.

8. The process of claim 1, wherein the pads have a height $H_{pad}$, and
wherein two adjacent pads are spaced by a distance D, conforming to formula (4):

$$H_{pad}/D < 2 \quad (4).$$

9. The process of claim 1, wherein the crystalline layer comprises silicon.

10. The process of claim 1, wherein the crystalline layer comprises SiC or $Al_2O_3$.

11. The process of claim 1, wherein the forming of the pads comprises etching the crystalline layer and etching only a first portion of the creep layer so as to keep a second portion of the creep layer between the pads.

12. The process of claim 1, wherein the forming of the pads is carried out so that $$d_{crystallite}/d_{pad} \geq k3 \quad (5),$$

wherein k3=3, $d_{pad}$ is a maximum dimension of the section of the pad (taken in a direction parallel to a main plane wherein the substrate extends, $d_{crystallite}$ is a dimension of the crystallite measured in the same direction as $d_{pad}$ at a time of coalescence of the crystallites.

13. The process of claim 1, wherein each pad has an upper face, and
wherein the growing by epitaxy of the crystallites takes place at least in part from the upper face.

14. The process of claim 1, wherein the creep layer comprises $SiO_2$.

15. The process of claim 1, wherein growing by epitaxy the crystallite on at least some of the pads and continuing the epitaxial growth of crystallites at least until coalescence of the crystallites carried by two adjacent pads, so as to form the nitride layer comprises forming a void having bottom and side surfaces at least partially defined by the etched creep layer and a top surface at least partially defined by a bottom surface of the coalesced crystallites.

16. The process of claim 1, wherein the pads comprise a buffer layer surmounting the crystalline layer, the buffer layer comprising a different material from that of the nitride layer.

17. The process of claim 16, wherein the buffer layer is formed by epitaxy deposition on top of the crystalline layer, before the forming of the pads by etching.

18. The process of claim 16, wherein the nitride layer is a gallium nitride layer (GaN), and
wherein the pads comprise, before the growing by epitaxy of the nitride layer, a priming layer, surmounting the buffer layer and comprising gallium nitride (GaN).

19. A microelectronic device, comprising:
a continuous nitride (N) layer formed using the process of claim 1;
the pads; and
the substrate surmounted by the plurality of pads,
wherein each pad comprises the first segment, as the creep segment, having the glass transition temperature, $T_{glass\ transition}$, and the second crystalline segment formed of a crystalline material,
wherein the creep segment and the crystalline segment are successively disposed from the substrate,
wherein the continuous nitride (N) layer is entirely supported by the pads, and
wherein a creep segment material and a nitride layer material are selected so that:

$$T_{epitaxy} > k1 \times T_{glass\ transition},$$

wherein $k1 > 0.8$, $T_{epitaxy}$ is a minimum temperature allowing formation of the nitride layer by epitaxy.

20. A light-emitting diode, comprising:
the device of claim 19.

* * * * *